(12) United States Patent
Otaka et al.

(10) Patent No.: US 6,563,383 B1
(45) Date of Patent: May 13, 2003

(54) VARIABLE GAIN CIRCUIT

(75) Inventors: Shoji Otaka, Yokohama (JP); Osamu Watanabe, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 116 days.

(21) Appl. No.: 09/696,972

(22) Filed: Oct. 27, 2000

(30) Foreign Application Priority Data

Oct. 28, 1999 (JP) ............................................. 11-306798
Sep. 20, 2000 (JP) ....................................... 2000-284708

(51) Int. Cl.[7] .............................. H03F 3/45; H03F 3/30
(52) U.S. Cl. ....................................... 330/254; 330/285
(58) Field of Search ................................. 330/133, 134, 330/254, 285, 295

(56) References Cited

U.S. PATENT DOCUMENTS 6,172,567 B1 * 1/2001 Ueno et al. .................. 330/285

FOREIGN PATENT DOCUMENTS

JP          2000-196386         7/2000

OTHER PUBLICATIONS

Willy M.C. Sansen, et al., "An Integrated Wide–Band Variable–Gain Amplifier With Maximum Dynamic Range," IEEE Journal of Solid–State Circuits, vol. SC–9, No. 4, Aug. 1974, pp. 159–166.

Shoji Otaka, et al., "A Low–Power Low–Noise Accurate Linear–in–dB Variable Gain Amplifier With 500MHz Bandwidth," ISSCC Digest of Technical Papers, Feb. 9, 2000, pp. 386–389.

* cited by examiner

Primary Examiner—Steven J. Mottola
(74) Attorney, Agent, or Firm—Oblon, Spivak, McClelland, Maier & Neustadt, P.C.

(57) ABSTRACT

A variable gain circuit includes a variable gain amplifier which receives an input signal, outputs an amplified signal, and includes a first field-effect transistor, a gain control signal compensation circuit which outputs a gain control signal for controlling the gain of the variable gain amplifier and includes a second field-effect transistor, and a gain deviation correction circuit which corrects a gain deviation based on the variable gain amplifier and the gain control signal compensation circuit.

21 Claims, 11 Drawing Sheets

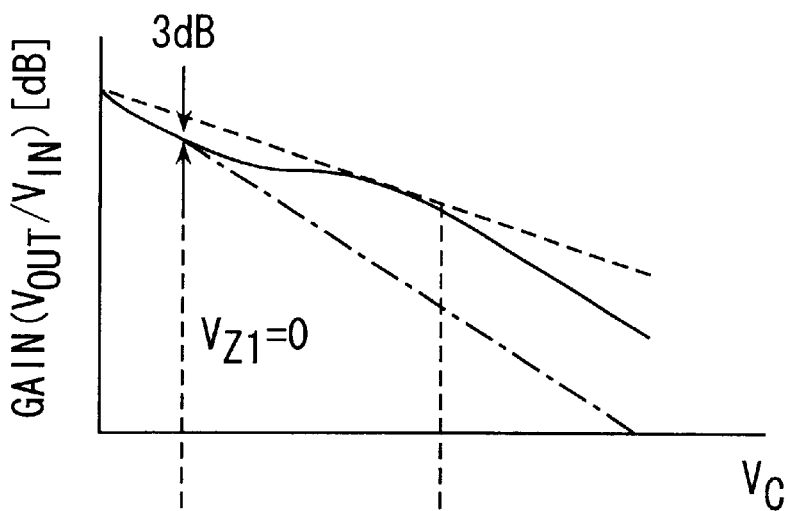
FIG. 1A
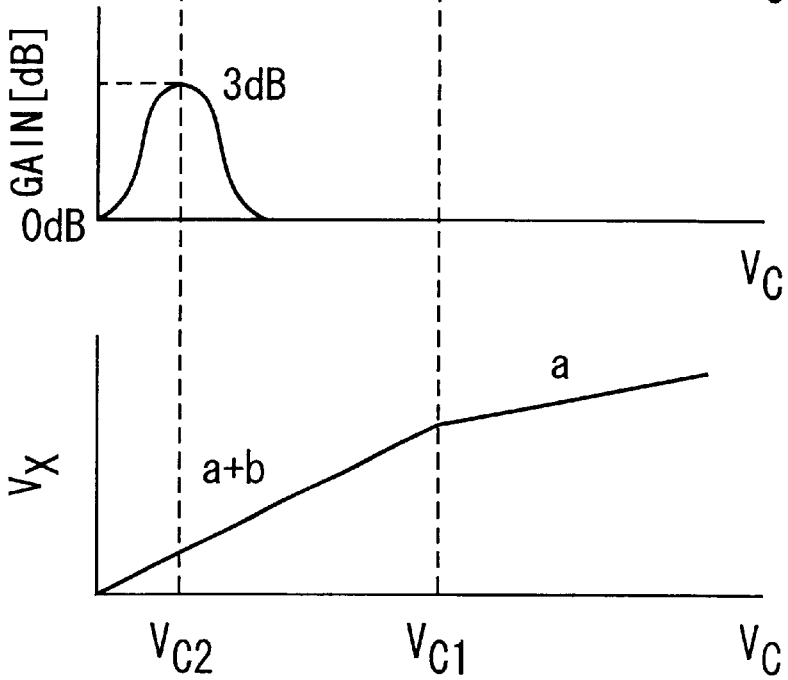
FIG. 1B
FIG. 1C
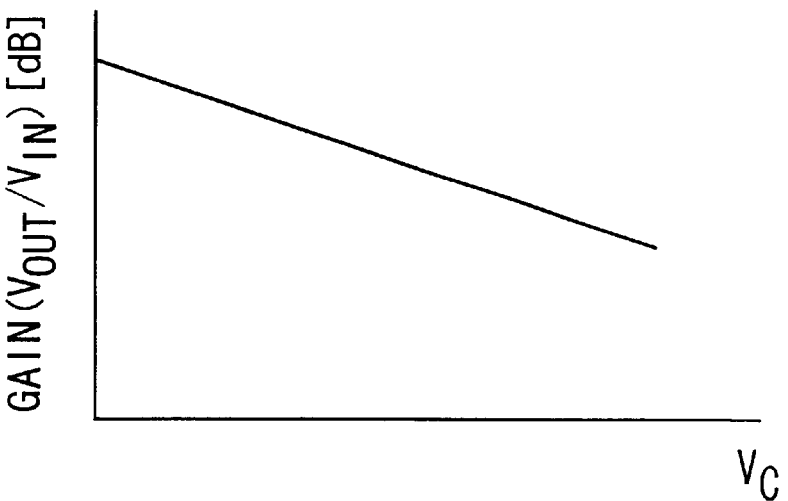
FIG. 1D

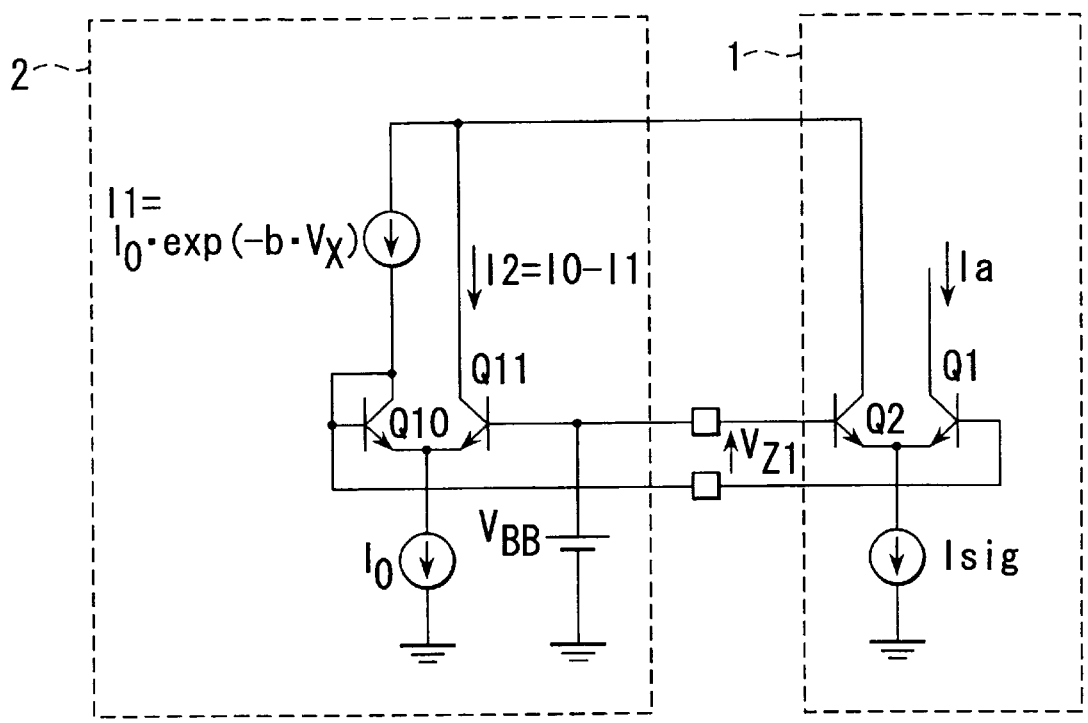
FIG. 16 PRIOR ART
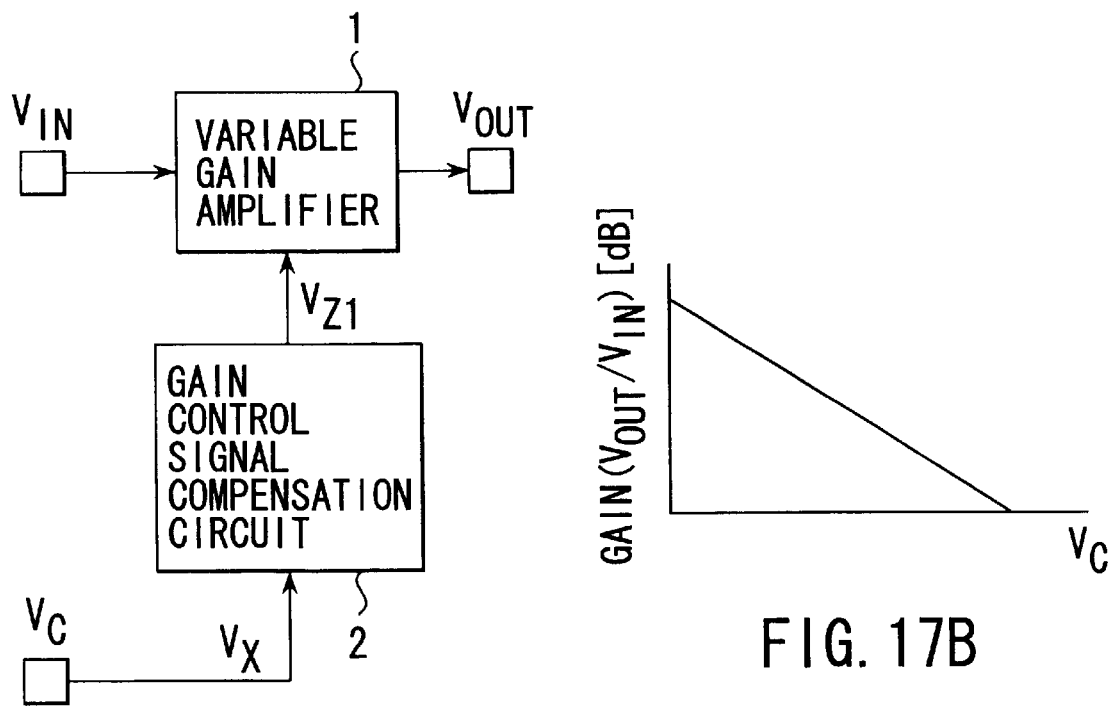
FIG. 17A PRIOR ART
FIG. 17B

VARIABLE GAIN CIRCUIT

CROSS-REFERENCE TO RELATED APPLICATIONS

This application is based upon and claims the benefit of priority from the prior Japanese Patent Applications No. 11-306798, filed Oct. 28, 1999; and No. 2000-284708, filed Sep. 20, 2000, the entire contents of which are incorporated herein by reference.

BACKGROUND OF THE INVENTION

The present invention relates to a variable gain circuit which is used for a portable radio transceiver or the like to linearly change the gain displayed in decibels (dB) in accordance with a gain control signal.

Recently, mobile communication facilities typified by portable telephones have been vigorously developed. These communication facilities are carried by users and mounted on automobiles and the like when they are used, and hence required to be reduced in size and weight. It is therefore strongly desired that the components of such a radio device be implemented in monolithic IC (Integrated Circuit) form suited for reductions in size and weight rather than being implemented in hybrid form having many components connected to each other as in the prior art.

There have been demands for a reduction in the cost of radio devices as well as a reduction in the size of components. The IC technology is also effective for a reduction in the cost of radio devices.

In addition, transmission power control is indispensable to CDMA (Code Division Multiple Access) radio transceivers that have been increasingly developed in recent years. Under certain circumstances, therefore, a transmission IF (Intermediate Frequency) variable gain circuit is required to perform signal level control on 70 dB or higher. In general, to perform such high-level gain control, the gain displayed in decibels is required to be linearly adjusted in accordance with a gain control signal. This operation is required to facilitate gain control.

FIG. 16 is a circuit diagram of a conventional variable gain circuit using bipolar transistors. This variable gain circuit is comprised of a variable gain amplifier 1 and a control signal compensation circuit 2. Bipolar transistors Q1 and Q2 constitute a differential pair. An IF signal (input current Isig) is input to the common emitter terminal. An output current Ia is extracted from the collector terminal of the bipolar transistor Q1. To generate the output current Ia from an input current Isig, a gain control signal $V_{z1}$ is input between the base terminals of the bipolar transistors Q1 and Q2. Note that the arrows in FIG. 16 indicate the directions of currents.

A current Isig-Ia flowing in the collector of the bipolar transistor Q2 is regarded as an unwanted current and designed to flow in a power supply (not shown) or the like. In this case, a transfer function from Isig to Ia is represented by $$\frac{I_a}{I_{sig}} = \frac{1}{1 + \exp\left(\frac{V_{z1}}{V_T}\right)} \tag{1}$$

where $V_T$ is the thermal voltage, which is about 26 mV at room temperature.

According to equation (1), under the condition of $1<<\exp(V_{z1}/V_T)$, the transfer function can be approximated by $Ia/Isig=1/\exp(V_{z1}/V_T)$. Obviously, as the gain control signal $V_{z1}$ increases, the gain (Ia/Isig) exponentially decreases.

If the above hypothesis ($1<<\exp(V_{z1}/V_T)$) does not hold, the relationship between the gain control signal $V_{z1}$ and the gain (Ia/Isig) deviates from an exponential relationship. That is, if the hypothesis of $1<<\exp(V_{z1}/V_T)$ does not hold with respect to the gain control signal $V_{z1}$, the relationship between the gain (Ia/Isig) displayed in decibels and the gain control signal $V_{z1}$ becomes nonlinear. For this reason, there is proposed a variable gain circuit whose gain (Ia/Isig) decreases exponentially with respect to an internal gain control signal Vx by using a gain control signal compensation circuit 2 comprised of the bipolar transistors Q10 and Q11, a current source Io, a voltage source $V_{BB}$, and a gain control current source $I_1=Io\cdot\exp(-b\cdot Vx)$ for gain correction [see Japanese Patent Application No. 10-370290 (Jpn. Pat. Appln. KOKAI Publication No. 2000-196386) as the specification of a previous application]. When this gain control signal compensation circuit 2 is used, the gain control signal Vx and gain (Ia/Isig) are given by $$\frac{I_a}{I_{sig}} = \exp(-b \cdot V_x) \tag{2}$$

where b is a constant, which is 2 to 4, for example. FIG. 17A is a block diagram of a conventional variable gain circuit using bipolar transistors. FIG. 17B is a graph showing the relationship between an external gain control signal Vc supplied from the outside of the variable gain circuit and a voltage gain GAIN (Vout/Vin) (dB). Reference symbol (dB) denotes a gain displayed in decibels; ditto for the following description. In this case, the external gain control signal Vc is equal to the internal gain control signal Vx, and Isig= $g_1\cdot$Vin and Ia=$g_2\cdot$Vout, where $g_1$ and $g_2$ are the conductance, which is, for example, 0.1(A/V).

By using the block arrangement shown in FIG. 17A, the internal gain control signal Vx and gain (Ia/Isig) have an exponential relationship. However, this relationship holds only when bipolar transistors are used.

More specifically, if the variable gain circuit in FIG. 16 is formed by using field-effect transistors (FETs), the internal gain control signal Vx and gain (Ia/Isig) cease to have an exponential relationship. This problem will be described in detail below.

Note that the following FETs indicate n-type (n-channel) MOS transistors (MOSFETS) unless otherwise specified.

FIG. 18 shows the variable gain circuit in FIG. 16 which is formed by using MOSFETS, assuming that FETs are MOSFETS. In this case, with the use of the internal gain control signal $V_x$, $I_{D1}$ is given by $$I_{D1}=I_o\cdot\exp(-b\cdot V_x) \tag{3}$$

where Io is the current value of a constant current source, and b is a constant. Referring to FIG. 18, $I_{D2}=Io-I_{D1}$ holds. When this circuit is designed so that the current densities of the transistors M1 and M2 equal to those of the transistors M10 and M11, a current gain GMOS (=Iout1/Isig1) of a variable gain amplifier 11 is given by $$G_{MOS} = \frac{gm_{11}}{gm_{11} + gm_{10}} = \frac{gm_1}{gm_1 + gm_2} \tag{4}$$

where $gm_1$, $gm_2$, $gm_{10}$ and $gm_{11}$ are the transconductance of MOS transistors M1, M2, M10 and M11. Assuming that each of the transistors M10 and M11 exhibits a square characteristic which is a characteristic in a strong inversion, the relationships between currents $I_{D10}$ and $I_{D11}$ and gate voltages $V_{GS10}$ and $V_{GS11}$ are expressed as $$I_{D10}=\beta(V_{GS10}-V_{TH})^2 \quad (5)$$

$$I_{D11}=\beta(V_{GS11}-V_{TH})^2 \quad (6)$$

where $I_{D10}$ is the drain current of the transistor M10, $I_{D11}$ is the drain current of the transistor M11, $V_{GS10}$ is the gate-to-source voltage of the transistor M10, $V_{GS11}$ is the gate-to-source voltage of the transistor M11, $\beta$ is $\mu \cdot \text{Cox} \cdot W/(2L)$, $\mu$ is the mobility of carriers, Cox is the oxide film capacitance per unit area, W is the channel width, L is the channel length, and $V_{TH}$ is the threshold voltage. From equations (4), (5), and (6), $G_{MOS}$ is given by $$G_{MOS} = \frac{2\sqrt{\beta \cdot I_{D1}}}{2(\sqrt{\beta \cdot I_{D1}} + \sqrt{\beta \cdot I_{D2}})} \quad (7)$$

$$= \sqrt{\frac{I_{D1}}{I_o + 2\sqrt{I_{D1} \cdot I_{D2}}}} \quad (8)$$

$$= \sqrt{\frac{I_o \cdot \exp(-b \cdot V_x)}{I_o + 2\sqrt{I_{D1} \cdot I_{D2}}}} \quad (9)$$

According to equation (9), if $I_{D1} \gg I_{D2}$ or $I_{D1} \ll I_{D2}$, the denominator in the root in the equation (9) can be approximated by Io. Equation (9) can therefore be rewritten as:

$$G_{MOS} = \sqrt{\exp(-b \cdot V_x)} \quad (10)$$

It is obvious from equations (10) and (2) that the relationship between the gain (dB) and the internal gain control signal Vx in the case where MOSFETs are used gradually approaches a straight line with a half slope as compared with the case where bipolar transistors are used.

If $I_{D1}=I_{D2}=Io/2$, i.e., $V_{z1}=0$, since the denominator in the root in equation (9) becomes 2Io, the gain takes a value as low as 3 dB with respect to the asymptote based on the gain control signal Vx and the gain $G_{MOS}$ (dB) obtained in the case where MOSFETs are used. If $I_{D1} \ll I_{D2}$, the current characteristic of each of the MOSFETs M1 and M11 deviates from the square characteristic and has an exponential characteristic. This characteristic is obtained when the transistor is in a weak inversion and approximated by $$I_{D1}=A \cdot \exp\{c(V_{GS}-V_{TH1})\} \quad (11)$$

where A, c, and $V_{TH}$ are constants, and $V_{GS}$ is the gate-to-source voltage of the transistor M1. At this time, $gm_1 = c \cdot I_{D1}$, the gain GMOS can be approximated by $$G_{MOS} = \frac{c \cdot I_{D1}}{c \cdot I_{D1} + 2\sqrt{\beta \cdot I_{D2}}} \quad (12)$$

$$\sim \frac{c \cdot I_o \cdot \exp(-b \cdot V_x)}{2\sqrt{\beta \cdot I_o}} \quad (13)$$

where $c \cdot I_{D1} \ll 2\sqrt{(\beta \cdot I_{D2})}$ and ID2 is up to Io. From this equation, if $I_{D1} \ll I_{D2}$, the same slope as that of the characteristic curve based on bipolar transistors is obtained.

Gain characteristics in consideration of the two operation regions of MOSFETs described above are shown in FIG. 1A. As is obvious from FIG. 1A as well, when MOSFETs are used, the gain (dB) does not change linearly with respect to the external gain control signal Vc (=Vx). In controlling the gain of a radio transceiver, for the sake of easy control, it is required that the relationship between the gain (dB) displayed in decibels and the external gain control signal Vc can be linearly approximated. According to the characteristics of a variable gain circuit using MOSFETs, in particular, the relationship between the gain (dB) and the external gain control signal Vx cannot be linearly approximated in the condition that VGA's gain is high. If gain control is performed within the range in which linear approximation can be performed, the gain control range narrows. Accordingly, the number of variable gain amplifiers must be increased, resulting in an increase in current consumption. Furthermore, in general, an amplifier has low-noise characteristics at high gain, and hence the noise characteristics deteriorate.

BRIEF SUMMARY OF THE INVENTION

It is an object of the present invention to provide a variable gain circuit which uses field-effect transistors and can linearly adjust the gain displayed in decibels in accordance with an externally supplied control signal.

According to a first aspect of the invention, there is provided a variable gain circuit comprising a variable gain amplifier which receives an input signal, outputs an amplified signal, and includes a first field-effect transistor, a gain control signal compensation circuit which outputs a gain control signal for controlling a gain of the variable gain amplifier and includes a second field-effect transistor, and a gain deviation correction circuit which corrects a gain deviation based on the amplified signal of the variable gain amplifier and the gain control signal of the gain control signal compensation circuit.

According to a second aspect of the invention, there is provided a variable gain circuit comprising a first variable gain amplifier which receives an input signal, outputs an amplified signal, and includes a first field-effect transistor, a second variable gain amplifier which receives the amplified signal, outputs an amplified output signal, and includes a second field-effect transistor, a first gain control signal compensation circuit which outputs a first gain control signal for controlling a gain of the first variable gain amplifier and includes a third field-effect transistor, a second gain control signal compensation circuit which outputs a second control signal for controlling a gain of the second variable gain amplifier, and a third gain control signal compensation circuit which receives an externally supplied external gain control signal, converts the external gain control signal into an internal gain control signal, and outputs the internal gain control signal to the first and second gain control signal compensation circuits.

According to a third aspect of the invention, there is provided a variable gain circuit comprising a first variable gain amplifier which receives an input signal, outputs an amplified signal, and includes a first field-effect transistor, a second variable gain amplifier which receives the amplified signal, outputs an amplified output signal, and includes a second field-effect transistor, a first gain control signal compensation circuit which outputs a first gain control signal for controlling a gain of the first variable gain amplifier and includes a third field-effect transistor, a second gain control signal compensation circuit which receives the first gain control signal and outputs a second gain control signal for controlling a gain of the second variable gain amplifier, and a third gain control signal compensation circuit which receives an externally supplied external gain control signal, converts the external gain control signal into an internal gain control signal, and outputs the internal gain control signal to the first gain control signal compensation circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1D are graphs showing the characteristics of a variable gain circuit and a correction method according to the present invention;

FIG. 16 is a circuit diagram of a conventional variable gain circuit using bipolar transistors;

FIGS. 17A and 17B are a block diagram of the conventional variable gain circuit using bipolar transistors and a graph showing the relationship between a gain control signal Vc and a voltage gain GAIN (Vout/vin)

DETAILED DESCRIPTION OF THE INVENTION

Figure 18:
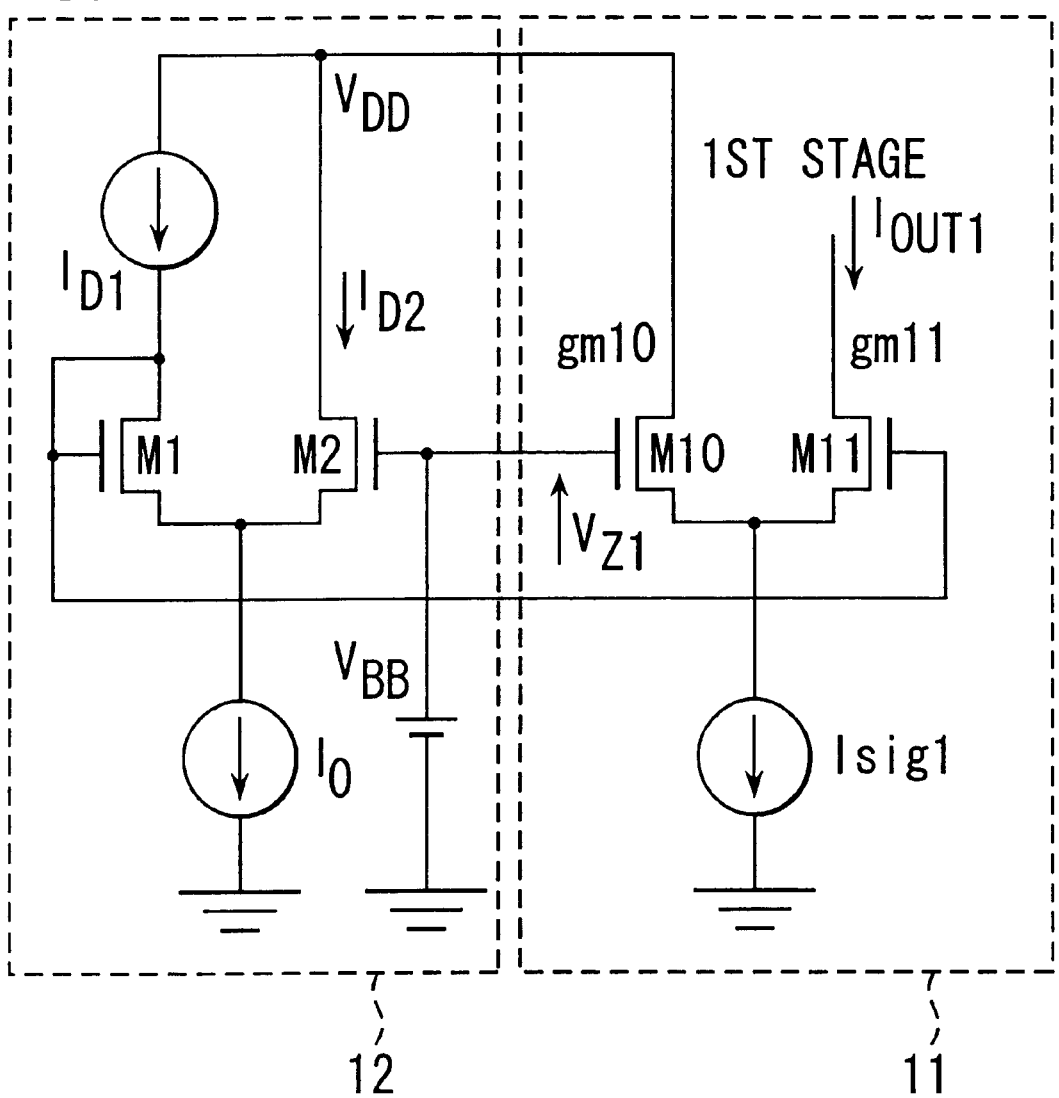
FIG. 18 is a circuit diagram showing a case where the bipolar transistors of the variable gain circuit in FIG. 16 are replaced with MOSFETS.

Embodiments of the present invention will be described below with reference to the views of the accompanying drawing. The solid line in FIG. 1A represents the gain (dB)-gain control signal characteristic of a circuit (FIG. 16) obtained by replacing the bipolar transistors of the variable gain circuit having the gain correction circuit, described in the prior art (FIG. 18), with FETs.

In the present invention, the FETs are assumed to be MOS field effect transistors (MOSFETS) which are most generally used. As described in the prior art, if external gain control signal Vc=Vc2, i.e., $I_{D1}=I_{D2}$ or Vz1=0 V (FIG. 18), the gain decreases by 3 dB from the characteristic curve (dotted line) which linearly approximates the gain (dB)-gain control signal characteristic. In addition, when Vc>Vc1, i.e., the MOSFETs are set in a weak inverse region, the slope of the gain-control signal characteristic (the slope of the dashed line) becomes almost twice as large as that when Vc<Vc1, according to equations (10) and (13).

The present invention makes the gain (dB)-gain control signal characteristic exhibit a linear characteristic within the range of Vc≧0 by adding a gain correction function to this characteristic. This characteristic will be referred to as linear-in-dB characteristic hereinafter. The purpose of obtaining the linear-in-dB characteristic is to implement a low-power-consumption, low-noise variable gain circuit.

To obtain the linear-in-dB characteristic, the present invention performs the following two gain correcting operations. In the first operation, as shown in FIG. 1B, gain correction is performed near $I_{D1}=I_{D2}$.

The second operation is performed to correct the gain deviation due to the transition of the operation region of each MOSFET from a strong inversion region to a weak inversion region. FIG. 1C is a graph showing this correction. Note that the second correction is not required when FETs having no inverted layers, e.g., J-FETs (Junction Field-Effect Transistors) or MESFETs (Schottky junction field effect transistors), are used. By performing the corrections shown in FIGS. 1B and 1C, a linear-in-dB characteristic can be obtained even if MOSFETs are used. FIG. 1D shows this characteristic.

(First Embodiment)

Figure 2:
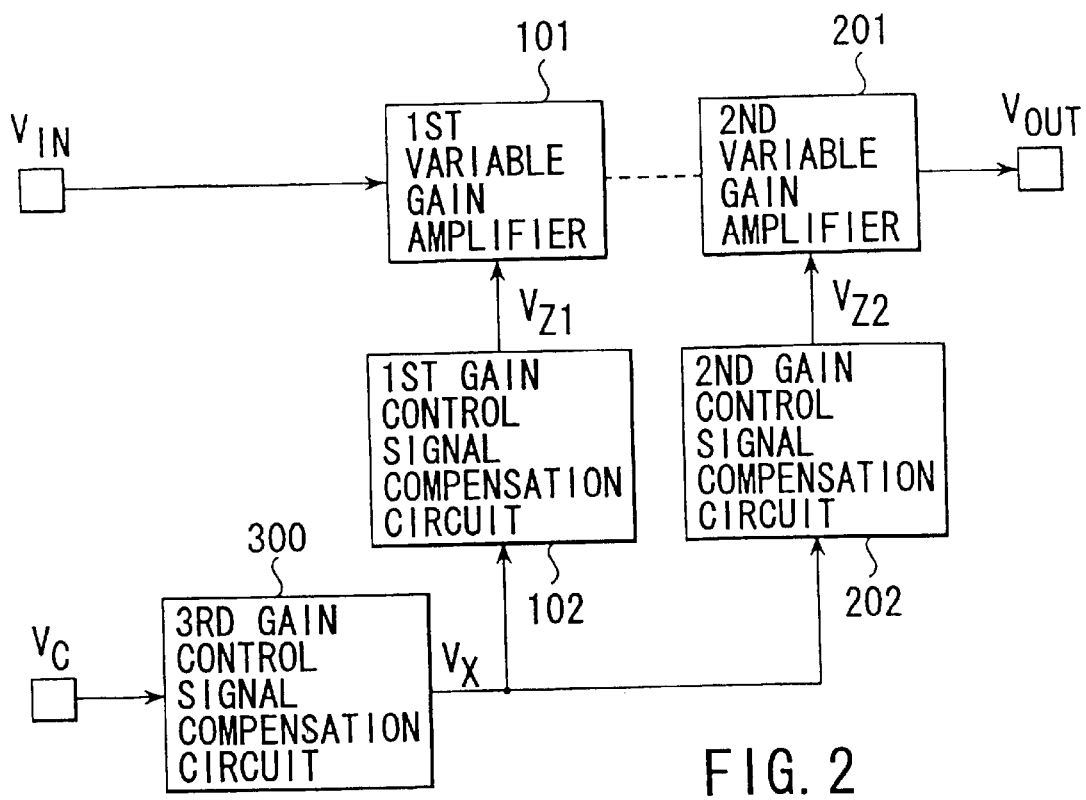
FIG. 2 is a block diagram showing a variable gain circuit according to the first embodiment of the present invention.

FIG. 2 is a block diagram showing a variable gain circuit according to the first embodiment which implements the gain correction method shown in FIGS. 1A to 1D. Reference symbols $V_{IN}$, $V_{OUT}$, and VC respectively denote an input terminal for a desired signal to be gain-controlled (signal to be controlled), an output terminal for the desired signal, and an external gain control signal input terminal. An external gain control signal $V_C$ supplied from the outside of the variable gain circuit is converted into an internal gain control signal $V_X$ through a third gain control signal compensation circuit 300. In this case, as shown in FIG. 1C, an external gain control signal Vc is converted with a gain a+b up to Vc1, and converted to Vc2 or higher with a gain a. The internal gain control signal $V_X$ is input to a first gain control signal compensation circuit 102 and second gain control signal compensation circuit 202 to be converted into first and second gain control signals Vz1 and Vz2, respectively. The first and second gain control signals Vz1 and Vz2 are respectively input to the gain control signal input terminals of first and second variable gain amplifiers 101 and 201. A desired signal $V_{IN}$ is input to the first variable gain amplifier 101 and gain-controlled in accordance with the gain control signal Vz1. The desired signal (amplified signal) gain-controlled by the first variable gain amplifier 101 is input to the second gain amplifier 201 to be gain-controlled in accordance with the gain control signal Vz2 and output as an output signal $V_{OUT}$. The input/output characteristics of the first and second gain control signal compensation circuits 102 and 202 will be described later, together with their circuit arrangements.

The second gain control signal compensation circuit 202 and second gain amplifier 201 in FIG. 2 constitute a gain deviation correction circuit for correcting a gain deviation produced near $I_{D1}=I_{D2}$ in the manner shown in FIG. 1B.

(Second Embodiment)

Figure 3:
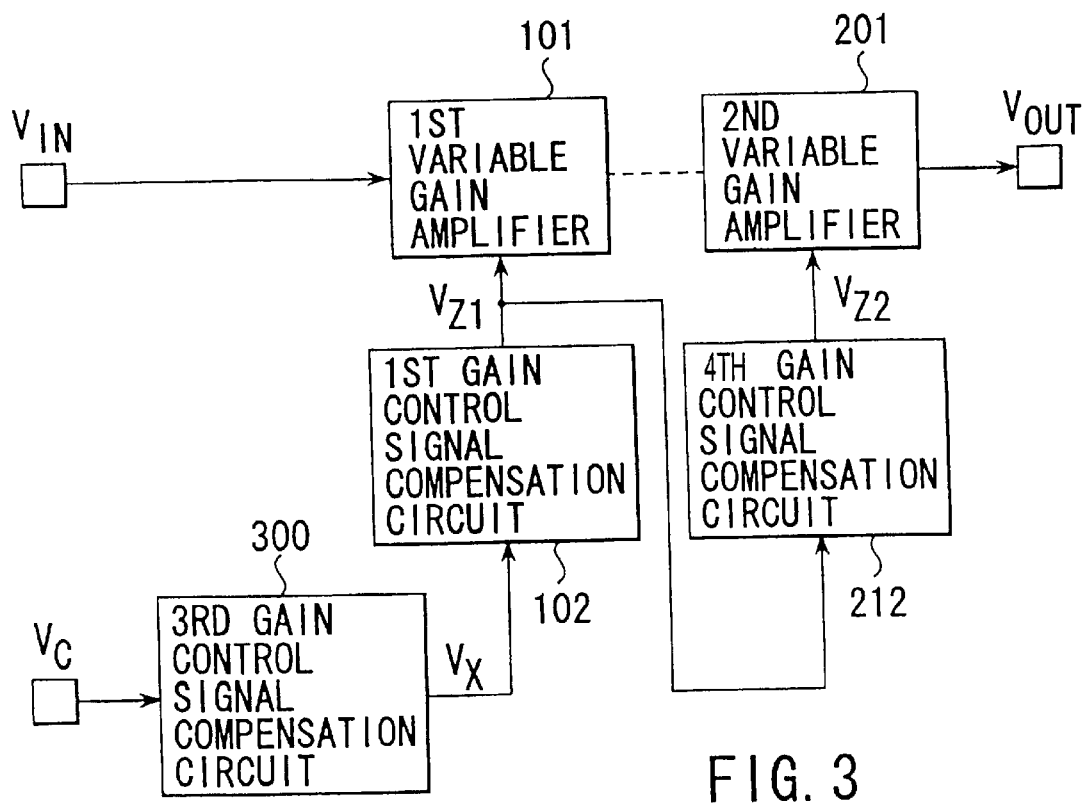
FIG. 3 is a block diagram showing a variable gain circuit according to the second embodiment of the present invention.

FIG. 3 is a block diagram showing a variable gain circuit according to the second embodiment. This circuit differs from the one shown in FIG. 2 in that the second gain control signal compensation circuit 202 is replaced with a fourth control signal compensation circuit 212, and an input signal to the fourth control signal compensation circuit 212 is a gain control signal Vz1 which is an output signal from a first gain control signal compensation circuit 102.

The first gain control signal compensation circuit 102, the fourth control signal compensation circuit 212, and a second variable gain amplifier 201 in FIG. 3 constitute a gain deviation correction circuit for correcting a gain deviation produced near $I_{D1}=I_{D2}$ in the manner shown in FIG. 1B.

If the gain deviation correction circuit shown in FIGS. 2 and 3 has a gain characteristic $G_{CMP}$:

$$G_{CMP} = \sqrt{\frac{I_o + 2\sqrt{I_{D1} \cdot I_{D2}}}{I_o}} \qquad (14)$$

it is obvious from equation (9) that gain correction can be performed.

In addition, even if the gain characteristic $G_{CMP}$ given by equation (14) cannot be accurately obtained, gain correction can be performed as long as the characteristic has an approximate means for equation (14).

The first variable gain amplifier 101 described above is designed in consideration of a single-stage arrangement. An arrangement obtained by n-stage cascade connection will be described next. Assume that n first variable gain amplifiers 101 are cascaded, and the gain control signal Vz1 from the first gain control signal compensation circuit 102 is supplied to each gain stage. In this case, a gain $G_{CMP}$ of the first variable gain amplifiers 101 becomes n times higher than that given by equation (9). Letting A' be a constant of proportionality, the gain $G_{MOSn}$ is given by $$G_{MOSn} = A' \left\{ \frac{I_o \cdot \exp(-b \cdot V_x)}{I_o + 2\sqrt{I_{D1} \cdot I_{D2}}} \right\}^{\frac{n}{2}} \qquad (15)$$

where $I_{D2}$ represents $Io-I_{D2}$. In this case, if the gain based on a second variable gain amplifier 201 and second gain control signal compensation circuit 202 (in the case shown in FIG. 2) or the second variable gain amplifier 201, fourth control signal compensation circuit 212, and first gain control signal compensation circuit 102 (in the case shown in FIG. 3) is expressed by $$G_{CMP} = B \left\{ \frac{I_o + 2\sqrt{I_{D1} \cdot I_{D2}}}{I_o} \right\}^{\frac{n}{2}} \qquad (16)$$

where B is a constant of proportionality gain correction can be performed.

No specific problem arises if the circuit has characteristics that satisfy equation (16) regardless of the number of second variable gain amplifiers 201 to be used.

Figures 4, 5:
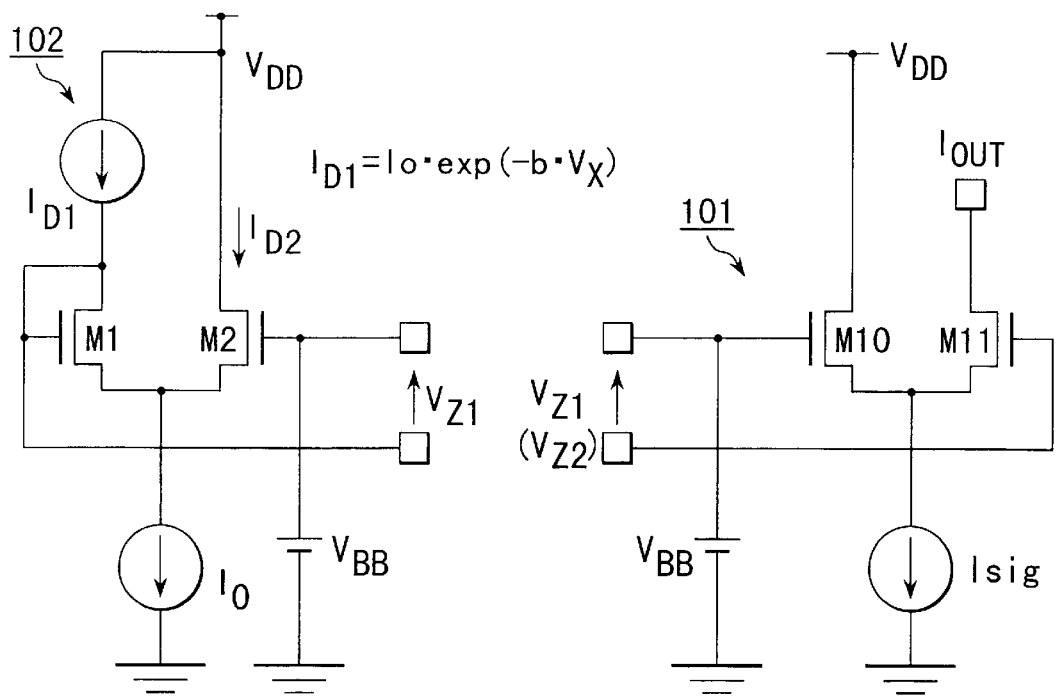
FIG. 4 is a circuit diagram showing a first gain control signal compensation circuit 102.
FIG. 5 is a circuit diagram showing a first variable gain amplifier 101.

The first and second embodiment will be described in detail next. FIG. 4 shows the detailed circuit arrangement of the first gain control signal compensation circuit 102 in FIGS. 2 and 3. The following transistors are n-type MOS-FETs (Nch MOSFETS) unless otherwise specified.

A transistor M1 has drain and gate terminals connected to each other. $I_{D1}$ is input to the drain terminal. The drain terminal of a transistor M2 is connected to a power supply voltage $V_{DD}$, and its source terminal is connected to the source terminal of the transistor M1 and grounded via a current source Io. A given power supply $V_{BB}$ is connected to the gate terminal of the transistor M2. The current $I_{D2}$ flowing in the drain terminal of the transistor M2 is the difference current between the current from the current source Io and the current $I_{D1}$($I_{D2}=Io-I_{D1}$). Referring to FIG. 4, the drain terminal of the transistor M2 is connected to the power supply voltage $V_{DD}$. However, no problem arises even if the connection of the drain terminal changes as long as a current flows to satisfy $I_{D2}=Io-I_{D1}$.

Assume that in this circuit, as $I_{D1}$ flows a current $$I_{D1}=I_o \cdot \exp(-b \cdot V_x) \qquad (17)$$

where b is a positive constant and $V_X$ is the internal gain control signal output from a third gain control signal compensation circuit 300. The internal gain control signal $V_X$ is converted into $I_{D1}$ in equation (17) by a method that uses exponential characteristics based on bipolar transistors. Since this operation can be implemented by the technique used in Japanese Patent Application No. 10-370290 (Jpn. Pat. Appln. KOKAI Publication No. 2000-96386), a detailed description thereof will be omitted. As long as an exponential characteristic can be obtained by using a method different from that disclosed in Japanese Patent Application No. 10-370290, no problem arises if this method is used. Referring to FIG. 4, assuming that the circuit block for converting the internal gain control signal $V_X$ into the current source $I_{D1}$ is included in the current source $I_{D1}$, a description of the circuit of the exponential characteristic conversion section will be omitted. Also assuming that the transistors M1 and M2 have square characteristics, the transfer function of the first gain control signal compensation circuit 102 formed by the above circuit is expressed as $$V_{z1} = \sqrt{\frac{I_{D2}}{\beta}} - \sqrt{\frac{I_{D1}}{\beta}} \qquad (18)$$

$$= \frac{\sqrt{I_o\{1 - \exp(-b \cdot V_x)\}} - \sqrt{I_o \cdot \exp(-b \cdot V_x)}}{\sqrt{\beta}}$$

Note that $I_{D1}$ and $I_{D2}$ are given by $$I_{D1}=\beta(V_{GS1}-V_{TH})^2 \qquad (19)$$

$$I_{D2}=\beta(V_{GS2}-V_{TH})^2 \qquad (20)$$

The first variable gain amplifier 101 and second variable gain amplifier 201 shown in FIGS. 2 and 3 will be described next with reference to FIG. 5.

The first variable gain amplifier 101 will be described first. The drain terminal of a transistor M10 is connected to the power supply voltage $V_{DD}$, and its source terminal is connected to the source terminal of a transistor M11 and grounded through a current source Isig including a desired signal to be gain-controlled. An output current $I_{out}$ flows in the drain terminal of the transistor M11.

The gain control signal Vz1 which is an output signal from the first gain control signal compensation circuit 102 is applied between the gate terminals of the transistors M10 and M11.

Although a given voltage $V_{BB}$ is applied to the gate electrode of the transistor M10, if this voltage has already been applied from the first gain control signal compensation circuit 102, the given voltage $V_{BB}$ is not required. Although the above description is associated with the first variable gain amplifier 101, the same applies to the second variable gain amplifier 201. In the case of the second variable gain amplifier 201, however, the gain control signal Vz2 as an output signal from the second gain control signal compensation circuit 202 or fourth control signal compensation circuit 212 is applied between the gate electrodes of the transistors M10 and M11.

The second gain control signal compensation circuit 202 in FIG. 2 and the fourth control signal compensation circuit 212 in FIG. 3 will be described next with reference to FIG. 6. The second gain control signal compensation circuit 202 is obtained by cascading a sixth gain control signal compensation circuit 122 which is similar to the first gain control signal compensation circuit 102, a voltage/current converter 400 represented by Iz1=f(Vz1), and a fifth gain control signal compensation circuit 112 which is similar to the first gain control signal compensation circuit 102. Note that an input current to the fifth gain control signal compensation circuit 112 is the sum current of the output current Iz1 from the voltage/current converter and a predetermined DC bias current $I_{BB}$.

With a function that maximizes Iz1 when Iz1=f(Vz1) or Vz1=0 V (i.e., $I_{D1}=I_{D2}$), and gradually decreases Iz1 as the absolute value of Vz1 increases, gain correction can be realized by the second gain control signal compensation circuit 202 and second variable gain amplifier 201. This operation will be described below.

When $I_{D1}=I_{D2}$, the first gain control signal compensation circuit 102 and first variable gain amplifier 101 in FIG. 2 decreases the gain by 3 dB. At this time, Vz1 at the second gain control signal compensation circuit 202 becomes 0 V, and Iz1 becomes a maximum current Iz1.max. Since the input signal to the fifth gain control signal compensation circuit 112 becomes a maximum value Iz1.max.+$I_{BB}$(A), a gain control signal Vz2 which is an output voltage from the second gain control signal compensation circuit 202 is minimized. Therefore, the gain of the second variable gain amplifier 201 shown in FIG. 5 takes a maximum value. As the absolute value of Vz1 increases, Iz1 decreases. In this case, since the input current to the fifth gain control signal compensation circuit 112 decreases, the output voltage Vz2 from the second gain control signal compensation circuit 202 increases. As a consequence, the gain of the second variable gain amplifier 201 in FIG. 5 decreases.

In summary, the second gain control signal compensation circuit 202 and second variable gain amplifier 201 operate such that the gain reaches a maximum value when Vz1=0 V, and decreases as the absolute value of Vz1 increases. Therefore, the gain deviation caused by the first gain control signal compensation circuit 102 and first variable gain amplifier 101 can be corrected by the second gain control signal compensation circuit 202 and second variable gain amplifier 201.

Figure 6:
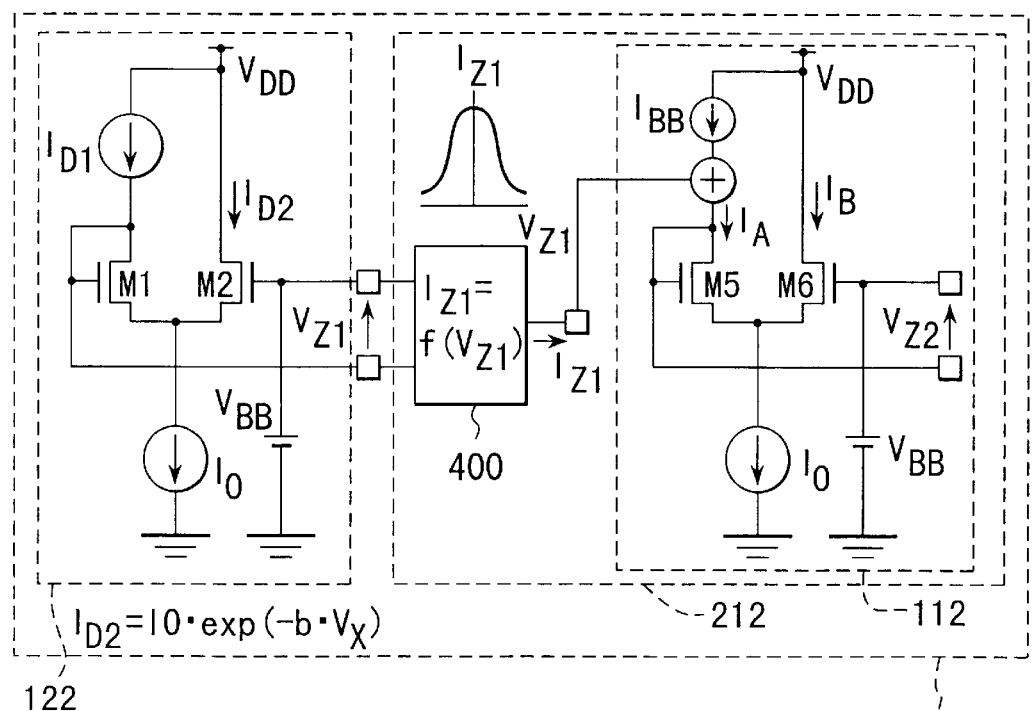
FIG. 6 is a circuit diagram showing a second gain control signal compensation circuit 202 and fourth control signal compensation circuit 212.
Figure 7:
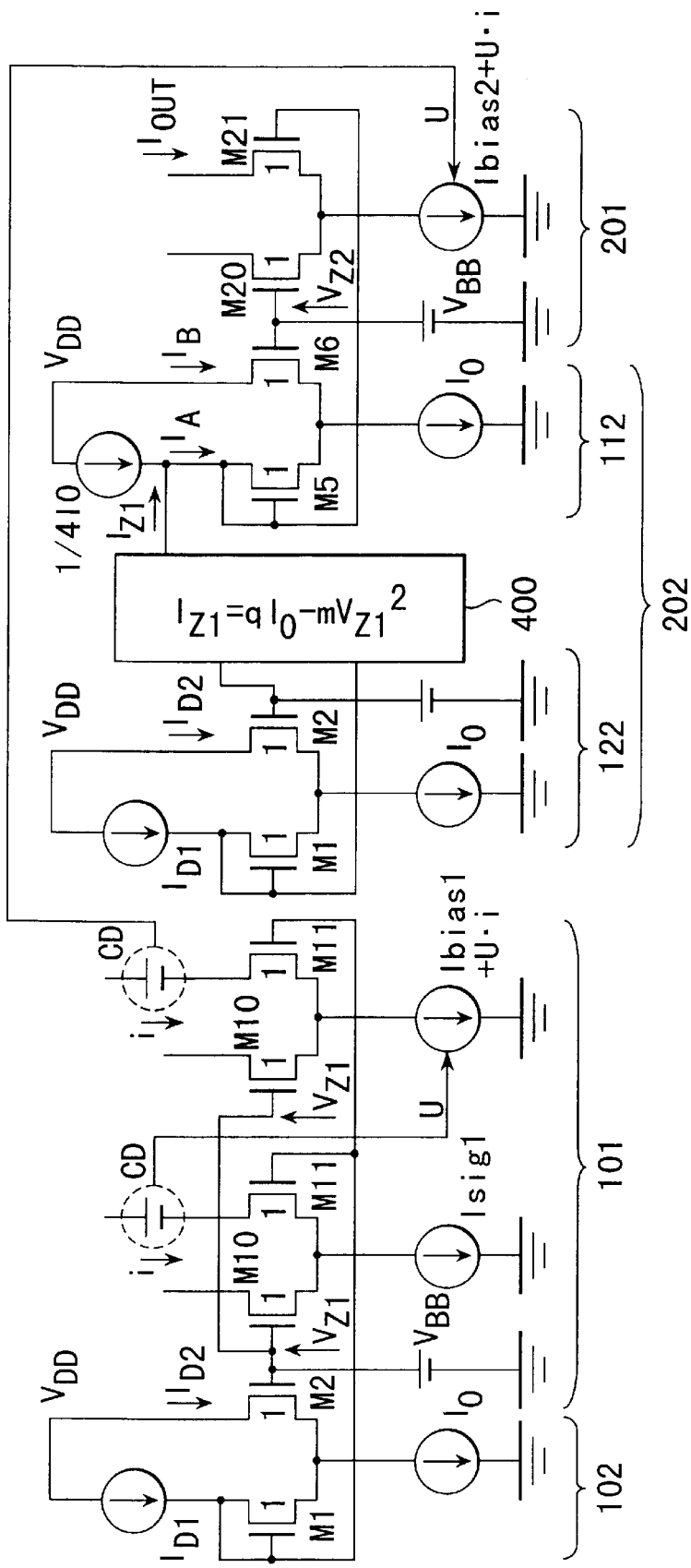
FIG. 7 is a circuit diagram showing the details of the variable gain circuit in FIG. 2.
Figure 8:
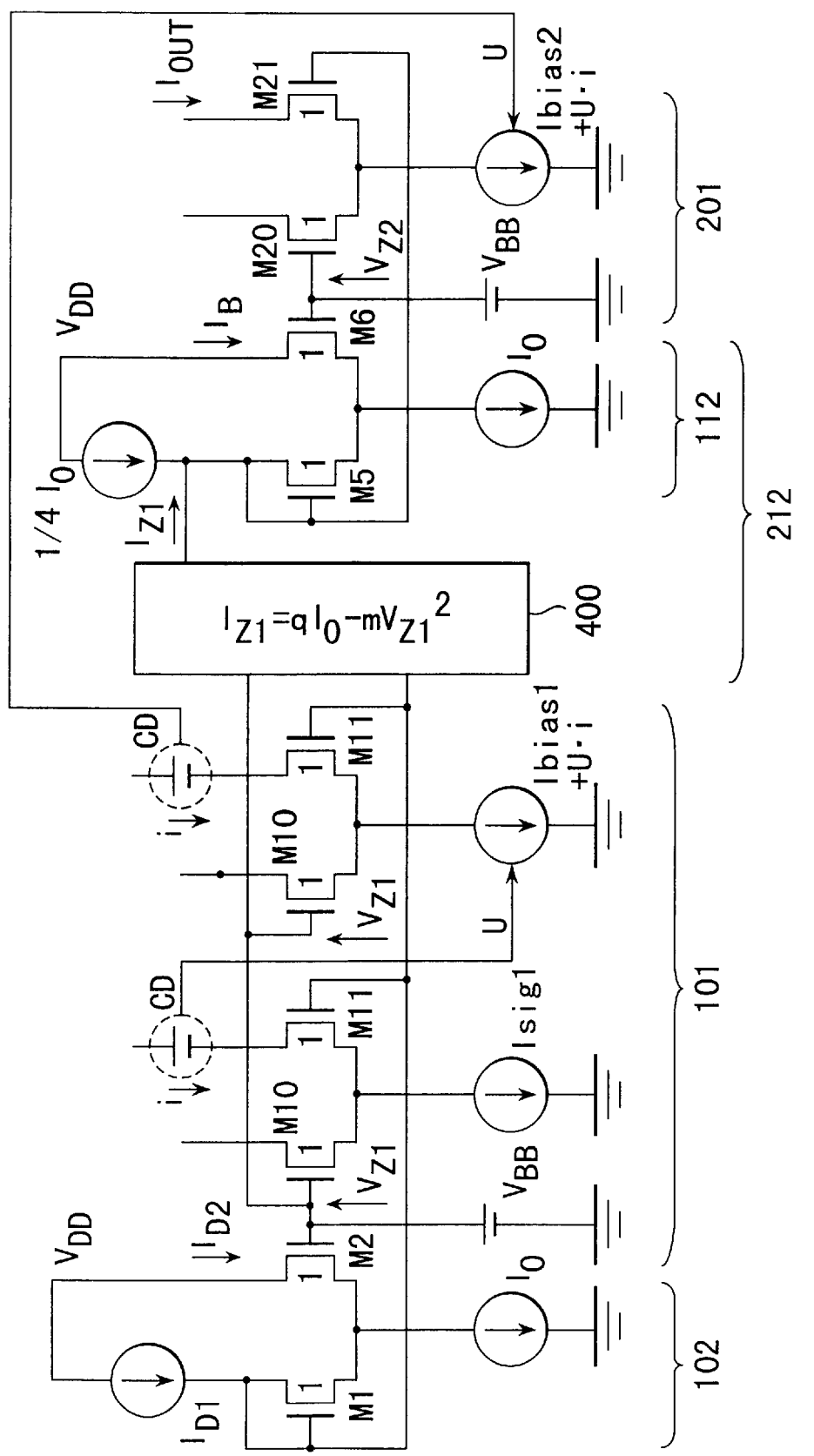
FIG. 8 is a circuit diagram showing the details of the variable gain circuit in FIG. 3.

In this case, if the second embodiment (the variable gain circuit in FIG. 3) is used in place of the first embodiment (the variable gain circuit in FIG. 2), since the fourth control signal compensation circuit 212 in FIG. 3 receives the first gain control signal Vz1 from the first gain control signal compensation circuit 102 in FIG. 3, the sixth gain control signal compensation circuit 122 in FIG. 6 or FIG. 7 is not required. Therefore, the circuit arrangement of the second embodiment shown in FIGS. 3 and 8 is smaller than that of the first embodiment shown in FIGS. 2 and 7. In the embodiment of FIG. 7, the currents i detected by current detectors CD, respectively, are amplified by current gain U to obtain the currents U·i. The currents U·i are added to the current sources Ibias1 and Ibias2, respectively.

An example of a method of implementing the above voltage/current converter 400 with Iz1=f(Vz1) will be described above with reference to FIG. 8, in a case where the following circuit having a square characteristic (square circuit)

$$I_{z1} = q \cdot I_o - m \cdot V_{z1}^2 \tag{21}$$

where q and m are constants is used.

FIG. 8 relates to the second embodiment. After the two first variable gain amplifiers 101 are cascaded, the resultant structure is connected to the gain deviation correction circuit made up of the fourth control signal compensation circuit 212 and second variable gain amplifier 201. Since the two first variable gain amplifiers 101 are cascaded, a gain $G_{MOS2}$ becomes the square of equation (9) and expressed by $$G_{MOS2} = \frac{I_o \cdot \exp(-b \cdot V_x)}{I_o + 2\sqrt{I_{D1} \cdot I_{D2}}} \tag{22}$$

Assume in this case that the current gain (U) between the respective variable gain stages is 1.

According to equation (22), when $1_{D1}=I_{D2}$, the gain $G_{MOS2}$ decreases by 6 dB. Gain correction can be attained by the voltage/current converter 400 and second variable gain amplifier 201 represented by equation (21). This will be described below. For the sake of simplicity, assume that the dimensional ratio between the respective transistors is 1, and $I_{BB}$=Io/4. In this case, the dimensional ratio between the respective transistors corresponds to W/L, where W is the channel width and L is the channel length. In general, the channel length is constant.

In the above circuit arrangement, an input current $I_A$ to the fifth gain control signal compensation circuit 112 is given by $$I_A = \frac{I_o}{4} + q \cdot I_o - m \cdot V_{z1}^2 \tag{23}$$

$$= \left(\frac{1}{4} + q\right) I_o - m \cdot V_{z1}^2$$

$$= p \cdot I_o - m \cdot V_{z1}^2$$

where p=¼+q. The gain control signal Vz1 input to the voltage/current converter 400 is given by $$V_{z1} = \sqrt{\frac{I_{D2}}{\beta}} - \sqrt{\frac{I_{D1}}{\beta}} \tag{24}$$

Substitution of equation (24) into equation (23) yields $I_A$ given by $$I_A = \left(p - \frac{m}{\beta}\right) I_o + \frac{2m}{\beta} \sqrt{I_{D1} \cdot I_{D2}} \tag{25}$$

where $I_{D2}$=Io−$I_{D1}$.

In this case, if the circuit is designed to set the output current Iz1 from the voltage/current converter 400 to 0 A when $I_{D1}$=0 A, $I_A$ and $I_B$ are given by $$I_A = \frac{1}{4}I_o + \frac{2m}{\beta}\sqrt{I_{D1} \cdot I_{D2}} \quad (26)$$

$$I_B = \frac{3}{4}I_o - \frac{2m}{\beta}\sqrt{I_{D1} \cdot I_{D2}} \quad (27)$$

In this case, the gain $G_{CMP}$ of the second variable gain amplifier 201 is given by $$G_{CMP1} = \frac{\sqrt{I_A}}{\sqrt{I_A} + \sqrt{I_B}}$$

$$= \sqrt{\frac{I_A}{I_o + 2\sqrt{I_A \cdot I_B}}} \quad (28)$$

If equations (26) and (27) are substituted into equation (28), a gain $G_{CMP1}$ of the second variable gain amplifier 201 is expressed as a function of $I_{D1}$.

To check any error between the gain $G_{CMP}$ of an ideal variable gain amplifier and the gain $G_{CMP1}$ of the second variable gain amplifier 201, $G_{CMP}/G_{CMP,MAX}$ and $G_{CMP1}/G_{CMP1,MAX}$, which are obtained by normalizing the respective gains with maximum values, are compared with each other. Table 1 is a comparison table. Note that p=0.9.

TABLE 1

| $I_{D1}$ | $G_{CMP}/G_{CMP, MAX}$ | $G_{CMP}/G_{CMP1, MAX}$ | difference |
|---|---|---|---|
| 0 | 6 dB | −6.1 dB | −0.1 dB |
| 0.05 Io | −2.9 dB | −3.2 dB | −0.3 dB |
| 0.1 Io | −1.9 dB | −2.4 dB | −0.5 dB |
| 0.2 Io | −0.9 dB | −1.2 dB | −0.3 dB |
| 0.3 Io | −0.4 dB | −0.6 dB | −0.2 dB |
| 0.4 Io | −0.1 dB | −0.1 dB | 0 dB |
| 0.5 Io | 0 dB | 0 dB | 0 dB |
| 0.6 Io | −0.1 dB | −0.1 dB | 0 dB |
| 0.7 Io | −0.4 dB | −0.6 dB | −0.2 dB |
| 0.8 Io | −0.9 dB | −1.2 dB | −0.3 dB |
| 0.9 Io | −1.9 dB | −2.4 dB | −0.5 dB |
| 0.95 Io | −2.9 dB | −3.2 dB | −0.3 dB |
| Io | 6 dB | −6.1 dB | −0.1 dB |

According to Table 1, a gain deviation of 0.5 dB or less can be obtained by using the voltage/current converter 400 having square characteristics for Iz1=f(Vz1). This indicates that gain correction can be satisfactorily achieved by the fourth control signal compensation circuit 212 and second variable gain amplifier 201.

Figure 9:
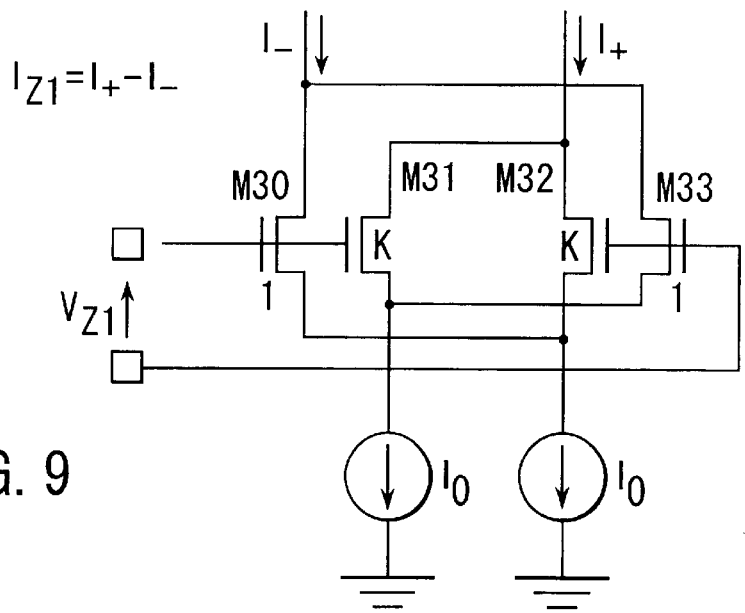
FIG. 9 is a circuit diagram of a voltage/current converter 400.

An example of the voltage/current converter 400 used in the above case will be described next with reference to FIG. 9. The drain terminal of a transistor M30 is connected to the drain terminal of a transistor M33 and used as a negative current output terminal I−. The drain terminal of a transistor M31 is connected to the drain terminal of a transistor M32 and used as a positive current output terminal I+. The gate terminal of the transistor M30 is connected to the gate terminal of the transistor M31, to which one gain control signal Vz1 is input. The gate terminal of the transistor M32 is connected to the gate terminal of the transistor M33, to which the other gain control signal Vz1 is input. The source terminals of the transistors M30 and M32 are commonly connected and grounded through the current source Io. A bias current from this current source Io of the differential circuit, is also called a tail current. The source terminals of the transistors M31 and M33 are commonly connected and grounded through the current source Io. The dimensional ratio between the transistors M30, M31, M32, and M33 is 1:K; K:1. Assume that the output current Iz1 is obtained by the difference between I+ and I−. The output current Iz1 from the circuit having this arrangement is given by $$I_{z1} = 2\frac{K-1}{K+1}I_o - 4\frac{K(K-1)\beta}{(K+1)^2}V_{z1}^2; |v_{z1}| \leq \sqrt{\frac{I_o}{K \cdot \beta}} \quad (29)$$

$$I_{z1} = -\frac{2K(K-1)\beta}{(K+1)^2}V_{z1}^2 + \frac{2K \cdot I_o}{K+1} - \quad (30)$$

$$\frac{4K \cdot \beta \sqrt{\frac{(K+1)I_o}{\beta}} - K \cdot V_{z1}^2}{(K+1)^2}|v_{z1}|; \sqrt{\frac{I_o}{K \cdot \beta}} \leq |v_{z1}| \leq \sqrt{\frac{I_o}{\beta}}$$

$$I_{z1} = 0; |v_{z1}| \leq \sqrt{\frac{I_o}{\beta}} \quad (31)$$

Obviously, as indicated by equation (29), square characteristics can be obtained within the range of $|Vz1| \leq \sqrt{(Io/(K \cdot \beta))}$. Comparing equation (29) based on this circuit and equation (21), therefore, the second gain control signal compensation circuit 202 or fourth control signal compensation circuit 212 can be implemented by $$q = 2\frac{K-1}{K+1} \quad (32)$$

$$m = 4\frac{K(K-1)\beta}{(K+1)^2} \quad (33)$$

Figure 10:
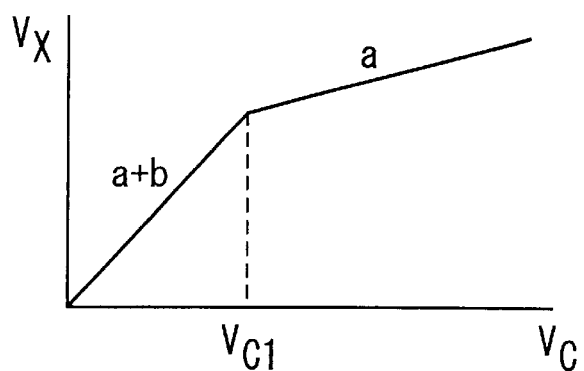
FIG. 10 shows the input/output characteristics of a third gain control signal compensation circuit 300.
Figure 11:
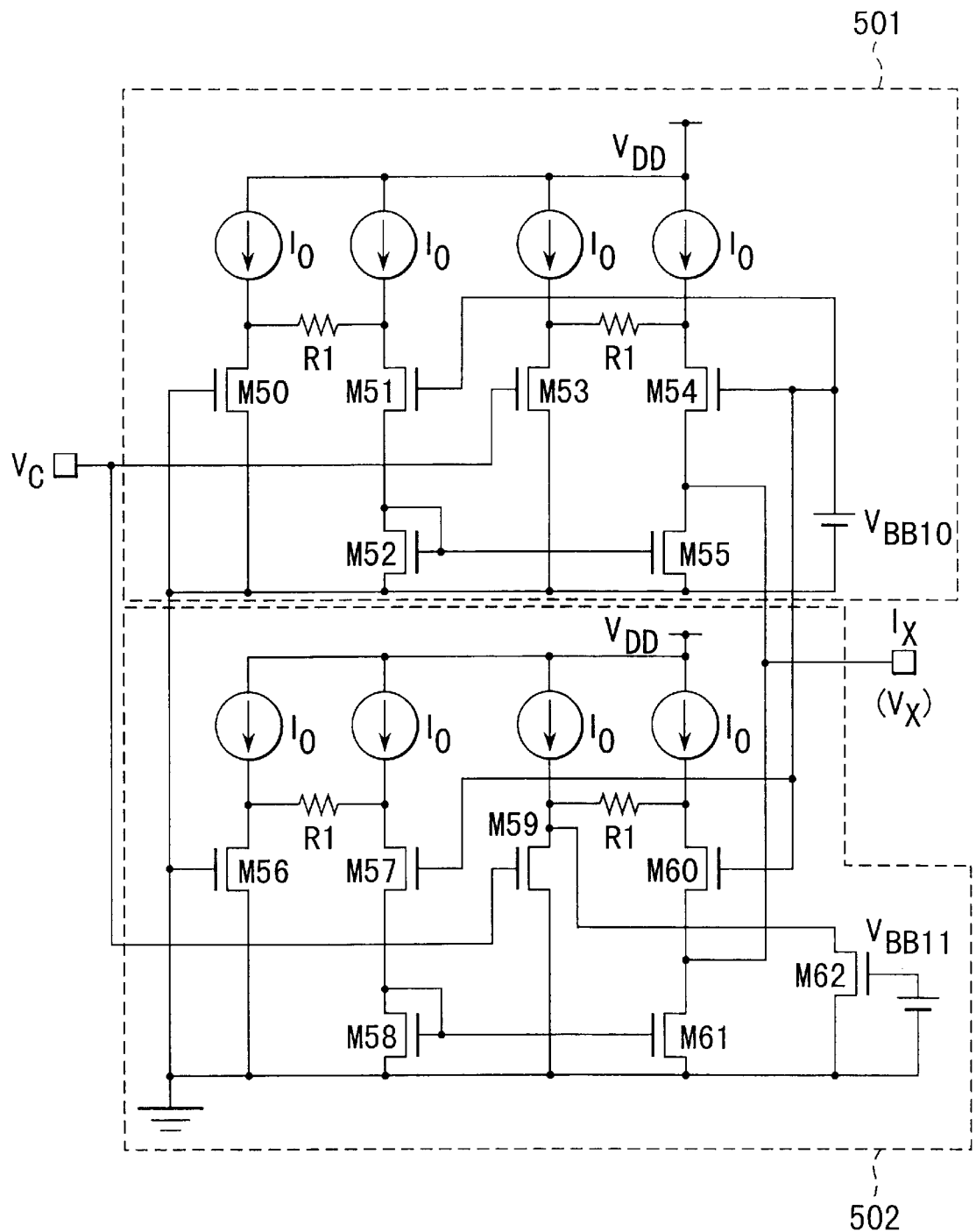
FIG. 11 is a circuit diagram of the third gain control signal compensation circuit 300.

Correction of a gain deviation unique to a MOSFET will be described next. FIG. 10 is a graph showing the input/output characteristics of the third gain control signal compensation circuit 300 for correcting the gain deviation caused by the transition of the operation region of the MOSFET from a strong inversion region to a weak inversion region. The third gain control signal compensation circuit 300 has a gain a+b while an externally supplied external gain control signal Vc remains in the range of 0 V to Vc1, and has a gain a when the external gain control signal Vc becomes Vc1 or higher. A corresponding internal gain control signal Vz is supplied to the first gain control signal compensation circuit 102 or second gain control signal compensation circuit 202. Although a constant b is determined by the exponential characteristic of the weak inverse region of the MOSFET, it generally takes a value almost equal to a. The internal gain control signal Vz can therefore expressed as $$V_x = a \cdot V_c + b \cdot \min(V_c, V_{c1}) \quad (34)$$

where min (Vc, Vc1) takes a smaller value of Vc and Vc1. By using this third gain control signal compensation circuit 300, the gain deviation caused by the transition of the operation region of the MOSFET from a strong inversion to a weak inversion can be corrected. FIG. 11 shows a specific circuit for implementing such characteristics. In this circuit, the outputs of circuits 501 and 502 are commonly connected. One circuit 501 is formed by parallel-connecting two differential circuits and comprised of transistors M51 to M55, current sources Io, and resistors R1. The other circuit 502 is formed by parallel-connecting two differential circuits and comprised of transistors M56 to M62, current sources Io, and resistors R1. Note that the transistors M52, M55, M58, and M61 are n-type FETs, and the remaining transistors are p-type FETS.

In the circuit 501, no current is output to the output terminal when the external gain control signal Vc is 0 V, and an output current Ix flows from the output terminal as the external gain control signal Vc increases in level. The circuit 502 operates in the same manner as the circuit 501 except that the maximum value of the source potential of M62 is limited by $V_{BB11}$ and M62. For this reason, in the circuit 502, the output current is fixed when Vc becomes a given potential or higher.

In this circuit, the transconductance of the circuits 501 and 502 is set to 1/R1 when the external gain control signal Vc is at the given potential or lower. If different transconductances are to be set, the resistance R1 of the circuit 502 may be set to be different from the resistance R1 of the circuit 501. In addition, in this circuit, the output is the current Ix. If, however, this current is flowed through a resistor, a voltage output can be obtained and converted into the external gain control signal Vc shown in FIG. 10.

As is obvious from the above description, the transconductances a and b shown in FIG. 10 can be obtained by setting the resistors R1 of the circuits 501 and 502 to a predetermined value.

Figure 12:
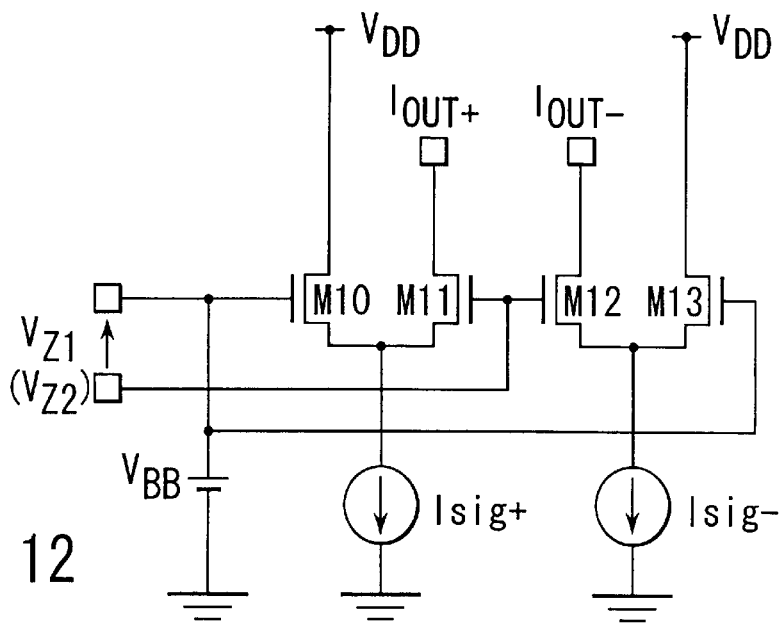
FIG. 12 is a circuit diagram of the first variable gain amplifier 101 formed by a differential circuit.
Figure 13:
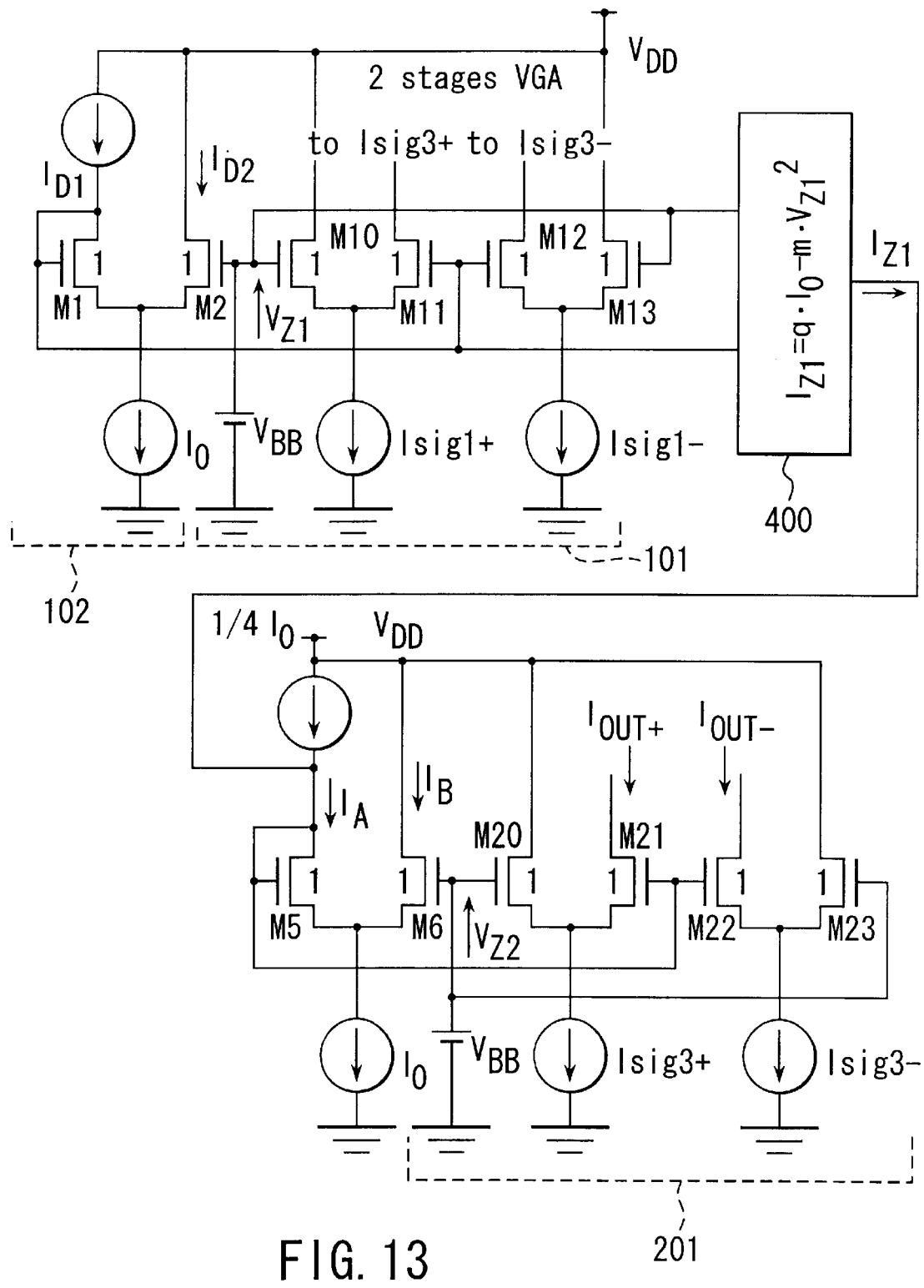
FIG. 13 is a circuit diagram showing the variable gain circuit in FIG. 8 formed by a differential circuit.

According to the above description, desired signals (signals to be controlled) are a single-phase input and single-phase output. Even if these signals are a differential input and differential output, gain control can be realized in the same manner as described above. FIG. 12 shows a circuit in which the first variable gain amplifier 101 or second variable gain amplifier 201 is formed by a differential circuit. FIG. 13 shows a circuit in which the variable gain circuit in FIG. 8 is formed by a differential circuit.

As described above, by using the present invention, the control voltage range for the external gain control signal Vc, in which the gain displayed in decibels linearly changes with respect to the externally supplied external gain control signal Vc, can be broadened. Therefore, gain control on a radio transceiver is facilitated. In addition, since the gain can be exponentially changed to a maximum gain, the S/N ratio can be maintained high.

Figure 14:
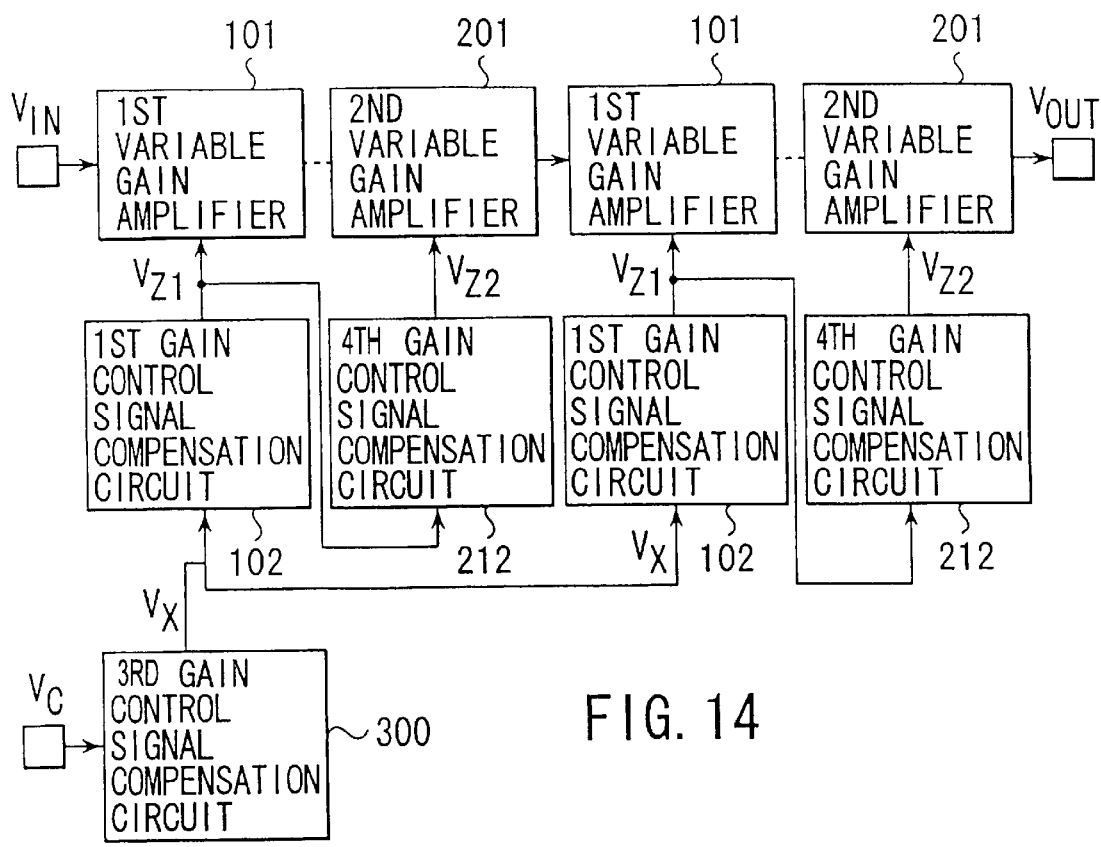
FIG. 14 is a circuit diagram of a variable gain circuit having a two-stage configuration.

The variable gain circuit may be constructed in a multi-stage configuration (two-stage configuration in the embodiment in FIG. 14).

Figure 15:
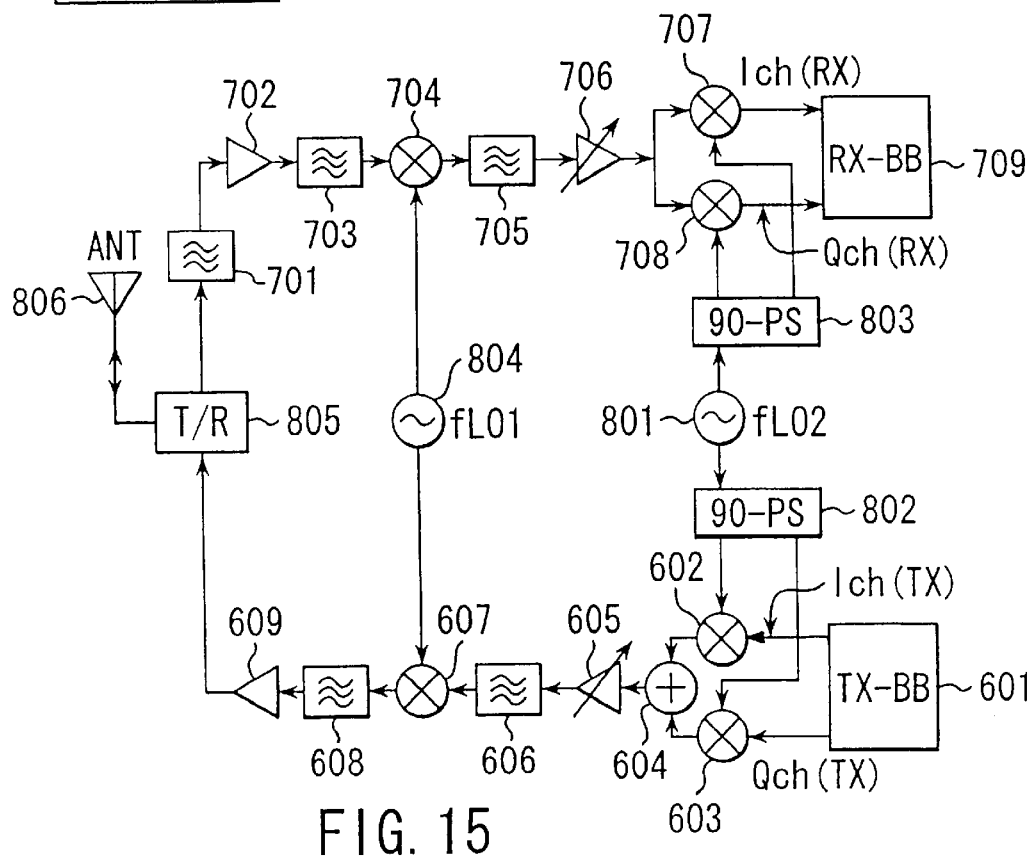
FIG. 15 is a block diagram showing an example of the arrangement of the radio circuit section of a heterodyne radio transceiver.

FIG. 15 shows a radio transceiver circuit in a portable telephone or another mobile radio communication device, to which the variable gain circuit of the present invention is applied. Although the TDD (Time Division Duplex) scheme of time-divisionally switching transmission/reception will be exemplified here, the present invention is not limited to this.

According to the radio transceiver circuit, in transmission, two quadrature baseband signals Ich(TX) and Qch(TX) generated by a baseband signal generating section are output from a baseband processing section 601 after being processed by a proper bandpass filter. In this case, a baseband is a signal to be transmitted. These baseband signals Ich(TX) and Qch(TX) are input a quadrature modulator comprised of mixers 602 and 603 and adder 604. This quadrature modulator modulates a second local oscillation signal having a frequency $f_{LO2}$. The second local oscillation signal is generated by a local oscillator 801 and separated into two quadrature signals by a 90° phase shifter (90-PS) 802. These signals are then input to the quadrature modulator.

The modulated signal output from this quadrature modulator is an IF signal and input to a variable gain circuit 605. The variable gain circuit 605 is a variable gain circuit based on the present invention, and adjusts the input IF signal to a proper signal level in accordance with a gain control signal (corresponding to the external gain control signal Vc) from a control system (not shown).

In this case, the IF signal is supplied as a current signal to the variable gain circuit 605. In the variable gain circuit described above, an output signal is extracted as a current signal. If a voltage signal is required as an output from the variable gain circuit 605, the current signal is converted into a voltage signal and output.

The IF signal output from the variable gain circuit 605 generally contains unwanted harmonics generated by the quadrature modulator and variable gain circuit 605. To remove the unwanted components, therefore, the IF signal is input to an up-converter 607 through a filter 606 formed by a low-pass filter (LPF) or bandpass filter (BPF).

The up-converter 607 multiplies the IF signal and a first local oscillation signal having a frequency $f_{LO1}$ and generated by a first local oscillator 804 to generate an RF signal having a frequency $f_{LO1}+f_{LO2}$ and an RF signal having a frequency $f_{LO1}-f_{LO2}$. One of these two RF signals is a desired wave, and the other is an unwanted image signal. In this case, the RF signal having the frequency $f_{LO1}+f_{LO2}$ is used as a desired wave. However, the RF signal having the frequency $f_{LO1}-f_{LO2}$ may be used as a desired wave. The image signal is removed by an image removing filter 608 formed by a BPF. The desired wave is amplified to a predetermined power level by a power amplifier 609 and supplied to an antenna 806 through a transmission/reception switch (or duplexer) 805 to be radiated as a radio wave.

In reception, a reception RF signal output from the antenna 806 is input to a low-noise amplifier (LNA) 702 through the transmission/reception switch (or duplexer) 805 and a filter 701 formed by a BPF. The reception RF signal amplified by the LNA 702 is input to a down-converter 704 through an image removing filter 703 formed by a BPF.

The down-converter 704 multiplies a first local oscillation signal having a frequency $F_{LO1}$ and generated by the first local oscillator 804 and the reception RF signal to frequency-convert the reception RF signal into an IF signal. This IF signal passes through a filter 705 formed by a BPF and is input to a quadrature demodulator comprised of a divider (not shown) and mixers 707 and 708 through a gain control circuit 706.

This gain control circuit 706 is a variable gain circuit based on the present invention described above, like the variable gain circuit 605 on the transmission side. The gain control circuit 706 adjusts the input IF signal to a proper signal level in accordance with a gain control signal (corresponding to the external gain control signal Vc) from a control system (not shown). In this case as well, the IF signal is supplied as a current signal to the gain control circuit 706. If a voltage signal is required as an output from the gain control circuit 706, the current signal is converted into a voltage signal and output it.

Quadrature second local oscillation signals having a frequency $f_{LO2}$ are input from the local oscillator 801 to the above quadrature demodulator through a 90° phase shifter 803, as in the case of the quadrature modulator on the transmission side. Outputs Ich(RX) and Qch(RX) from this quadrature demodulator are input to a reception-side baseband processing section 709, in which the reception signal is demodulated to reproduce the original baseband signal.

In this application, the present invention is applied to the IF-stage variable gain circuits 605 and 706. However, when the power amplifier 609 on the transmission side or the LNA 702 on the reception side, which is a high-frequency circuit, is to be formed by a variable gain circuit, the arrangement of the variable gain circuit of the present invention can be applied. Basically, in these cases, an IF signal is merely replaced with an RF signal as an input signal.

According to the present invention, there is provided a variable gain circuit using field-effect transistors, which can linearly adjust the gain displayed in decibels with respect to an externally supplied gain control signal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A variable gain circuit comprising:
   a variable gain amplifier which receives an input signal outputs an amplified signal, and includes a first field-effect transistor;
   a gain control signal compensation circuit which outputs a gain control signal for controlling a gain of said variable gain amplifier and includes a second field-effect transistor;
   a gain deviation correction circuit which corrects a gain deviation based on said variable gain amplifier and said gain control signal compensation circuit; and
   a gain control signal converter which converts an external gain control signal into an internal gain control signal, said variable gain amplifier including the first field-effect transistor being a first variable gain amplifier, the first gain control signal being a first gain control signal, said gain control signal compensation circuit including the second field-effect transistor being a first gain control signal compensation circuit,
   said gain deviation correction circuit including a second gain control signal compensation circuit and a second variable gain amplifier,
   said first gain control signal compensation circuit converting the internal gain control signal into the first gain control signal and inputting the first gain control signal to said first variable gain amplifier to control gain of said first variable gain amplifier, and
   said second gain control signal compensation circuit converting the internal gain control signal into the second gain control signal and inputs the second gain control signal to said second variable gain amplifier (201) to control gain of said second variable gain amplifier.

2. The circuit according to claim 1, wherein said first variable gain amplifier comprises multi-stage amplifiers.

3. The circuit according to claim 1, wherein said second gain control signal compensation circuit comprises a circuit obtained by cascading a first gain control signal compensation circuit unit having a structure equivalent to that of said first gain control signal compensation circuit, a voltage/current converter unit, and a second gain control signal compensation circuit unit having an arrangement equivalent to that of said first gain control signal compensation circuit.

4. The circuit according to claim 3, wherein said first variable gain amplifier comprises multi-stage amplifiers.

5. The circuit according to claim 3, wherein said voltage/current converter unit converts the first gain control signal Vz1 into a current signal Iz1 according to Iz1=f(Vz1), where Iz1 is an output current to be input to said second gain control signal compensation circuit unit, f is a function.

6. The circuit according to claim 5, wherein said first variable gain amplifier comprises multi-stage amplifiers.

7. A variable gain circuit comprising:
   a variable gain amplifier which receives an input signal, outputs an amplified signal, and includes a first field-effect transistor;
   a gain control signal compensation circuit which outputs a gain control signal for controlling a gain of said variable gain amplifier and includes a second field-effect transistor;
   a gain deviation correction circuit which is connected to the variable gain amplifier and corrects a gain deviation based on said variable gain amplifier and said gain control signal compensation circuit;
   a gain control signal converter which converts an external gain control signal into an internal gain control signal, said variable gain amplifier including the first field-effect transistor being a first variable gain amplifier, said gain control signal compensation circuit including the second field-effect transistor being a first gain control signal compensation circuit,
   said gain deviation correction circuit including a second gain control signal compensation circuit and a second variable gain amplifier,
   said first gain control signal compensation circuit converting the internal gain control signal into a first gain control signal,
   said second gain control signal compensation circuit converting the first gain control signal into a second gain control signal, and the first gain control signal being input to said first variable gain amplifier to control a gain of said first variable gain amplifier, and the second gain control signal being input to said second variable gain amplifier to control a gain of said second variable gain amplifier.

8. The circuit according to claim 7, wherein said first variable gain amplifier comprises multi-stage amplifiers.

9. The circuit according to claim 7, wherein said second gain control signal compensation circuit comprises a circuit obtained by cascading a voltage/current converter unit connected to an output of said first gain control signal compensation circuit, and a gain control signal compensation circuit unit having a structure equivalent to that of said first gain control signal compensation circuit.

10. The circuit according to claim 9, wherein said first variable gain amplifier comprises multi-stage amplifiers.

11. The circuit according to claim 9, wherein said voltage/current converter unit converts the first gain control signal Vz1 into a current signal Iz1 according to Iz1=f(Vz1), where Iz1 is an output current to be input to said second gain control signal compensation circuit unit, f is a function.

12. The circuit according to claim 11, wherein said first variable gain amplifier comprises multi-stage amplifiers.

13. A variable gain circuit comprising:
   a first variable gain amplifier which receives an input signal, outputs an amplified signal, and includes a first field-effect transistor;
   a second variable gain amplifier which receives the amplified signal, outputs an amplified output signal, and includes a second field-effect transistor;
   a first gain control signal compensation circuit which outputs a first gain control signal for controlling a gain of said first variable gain amplifier and includes a third field-effect transistor;
   a second gain control signal compensation circuit which outputs a second gain control signal for controlling a gain of said second variable gain amplifier; and
   a third gain control signal compensation circuit which receives an externally supplied external gain control signal, converts the external gain control signal into an internal gain control signal, and outputs the internal gain control signal to said first and second gain control signal compensation circuits.

14. A variable gain circuit comprising:

a first variable gain amplifier which receives an input signal, outputs an amplified signal, and includes a first field-effect transistor;

a second variable gain amplifier which receives the amplified signal, outputs an amplified output signal, and includes a second field-effect transistor;

a first gain control signal compensation circuit which outputs a first gain control signal for controlling a gain of said first variable gain amplifier and includes a third field-effect transistor;

a second gain control signal compensation circuit which receives the first gain control signal and outputs a second gain control signal for controlling a gain of said second variable gain amplifier; and a third gain control signal compensation circuit which receives an externally supplied external gain control signal, converts the external gain control signal into an internal gain control signal, and outputs the internal gain control signal to said first gain control signal compensation circuit.

15. The circuit according to claim 14, wherein said second gain control signal compensation circuit and said second variable gain amplifier compensate a gain deviation caused when the first field-effect transistor of said first variable gain amplifier and the third field-effect transistor of said first gain control signal compensation circuit operate in a strong inversion region.

16. The circuit according to claim 14, wherein said third gain control signal compensation circuit compensates a gain deviation caused when the first field-effect transistor of said first variable gain amplifier and the third field-effect transistor of said first gain control signal compensation circuit operate in a weak inversion region.

17. The circuit according to claim 14, wherein said first variable gain amplifier includes a first pair of field-effect transistors, the first gain control signal being input between gate terminals of the first pair of field-effect transistors, source terminals of the first pair of field-effect transistors being commonly connected and grounded through a first current source including the input signal, and said second variable gain amplifier includes a second pair of field-effect transistors, the second gain control signal being input between gate terminals of the second pair of field-effect transistors, source terminals of the second pair of field-effect transistors being commonly connected and grounded through a second current source including the amplified signal.

18. The circuit according to claim 14, wherein said first gain control signal compensation circuit includes a first pair of field-effect transistors, the internal gain control signal being input between gate terminals of the first pair of field-effect transistors, source terminals of the first pair of field-effect transistors being commonly connected and grounded through a first current source including a given current, and said second gain control signal compensation circuit includes a voltage/current converter represented by $Iz1=f(Vz1)$ where f indicates a function and Vz1 indicates the amplified signal of said first variable gain amplifier and a second pair of field-effect transistors, the second gain control signal being input between gate terminals of the second pair of field-effect transistors, source terminals of the second pair of field-effect transistors being commonly connected and grounded through a second current source including the amplified signal, and a drain terminal of one of the second pair of field-effect transistors being connected to said voltage/current converter.

19. The circuit according to claim 3, wherein said voltage/current converter unit converts the first gain control signal Vz1 into a current signal Iz1 according to $I_{z1}=q \cdot I_0 - m \cdot V_{z1}^2$, where Iz1 is an output current to be input to said second gain control signal compensation circuit unit, q and m are constants and Io is a current value of a constant current source.

20. The circuit according to claim 9, wherein said voltage/current converter unit converts the first gain control signal Vz1 into a current signal Iz1 according to $I_{z1}=q \cdot I_0 - m \cdot V_{z1}^2$, where Iz1 is an output current to be input to said second gain control signal compensation circuit unit, q and m are constants and Io is a current value of a constant current source.

21. A variable gain circuit comprising:

a first variable gain amplifier which receives an input signal, outputs an amplified signal, and includes a first field-effect transistor;

a first gain control signal compensation circuit which outputs a first gain control signal for controlling a gain of the first variable gain amplifier and includes a second field-effect transistor; and a gain deviation correction circuit including a second variable gain amplifier connected to an output of the first variable gain amplifier, and a second gain control signal compensation circuit which outputs a second gain control signal for controlling a gain of the second variable gain amplifier to correct a gain deviation based on the first variable gain amplifier.

* * * * *